United States Patent
Chuang et al.

(10) Patent No.: US 8,510,936 B2
(45) Date of Patent: Aug. 20, 2013

(54) MANUFACTURING METHOD OF PACKAGE CARRIER

(75) Inventors: Chih-Hong Chuang, Hsinchu (TW); Tzu-Wei Huang, Hsinchu (TW)

(73) Assignee: Subtron Technology Co., Ltd., Hsinchu (TW)

( * ) Notice: Subject to any disclaimer, the term of this patent is extended or adjusted under 35 U.S.C. 154(b) by 826 days.

(21) Appl. No.: 12/725,641

(22) Filed: Mar. 17, 2010

(65) Prior Publication Data

US 2011/0154657 A1 Jun. 30, 2011

(30) Foreign Application Priority Data

Dec. 29, 2009 (TW) .............................. 98145638 A

(51) Int. Cl.
*H05K 3/30* (2006.01)
(52) U.S. Cl.
USPC ............... 29/832; 29/831; 29/841; 29/854; 29/858; 438/124; 438/622
(58) Field of Classification Search
USPC ............. 29/829–858; 438/124, 622–625
See application file for complete search history.

(56) References Cited

U.S. PATENT DOCUMENTS

| 5,928,839 | A  | * | 7/1999  | Rath et al. ...................... 430/313 |
| 6,256,875 | B1 | * | 7/2001  | Watanabe et al. ............... 29/830 |
| 6,700,071 | B2 | * | 3/2004  | Takenaka et al. ............. 174/255 |
| 7,223,687 | B1 |   | 5/2007  | Ho et al. |
| 8,062,539 | B2 | * | 11/2011 | Nakamura ...................... 216/83 |
| 2005/0077083 | A1 | * | 4/2005 | Mattix ........................... 174/265 |
| 2005/0108874 | A1 | * | 5/2005 | Lee et al. ......................... 29/849 |
| 2005/0150686 | A1 | * | 7/2005 | Powell ........................... 174/262 |
| 2011/0061912 | A1 | * | 3/2011 | Kang et al. ..................... 174/258 |

FOREIGN PATENT DOCUMENTS

TW        I311035        6/2009

* cited by examiner

*Primary Examiner* — Paul D Kim
(74) *Attorney, Agent, or Firm* — J.C. Patents

(57) ABSTRACT

A manufacturing method of package carrier is provided. A first copper foil layer, a second copper foil layer on the first foil layer, a third copper foil layer and a fourth foil layer on the third foil layer are provided. The second copper foil layer is partially bonded the fourth copper foil layer by an adhesive gel so as to form a substrate of which the peripheral region is glued and the effective region is not glued. Therefore, the thinner substrate can be used in the following steps, such as patterning process or plating process. In addition, the substrate can be extended be the package carrier structure with odd-numbered layer or even-numbered layer.

20 Claims, 7 Drawing Sheets

MANUFACTURING METHOD OF PACKAGE CARRIER

CROSS-REFERENCE TO RELATED APPLICATION

This application claims the priority benefit of Taiwan application serial no. 98145638, filed on Dec. 29, 2009. The entirety of the above-mentioned patent application is hereby incorporated by reference herein and made a part of specification.

BACKGROUND OF THE INVENTION

1. Field of the Invention

The present invention relates to a method of manufacturing a semiconductor structure, and more particularly to a method of manufacturing a package carrier.

2. Description of Related Art

In the fabrication of semiconductors, chip package carrier is one of the most common used package components. The chip package carrier, for example, is a multi-layered circuit board, in which a plurality of circuit layers and a plurality of dielectric layers are alternately stacked. Each of the dielectric layers is disposed between two adjacent circuit layers, and the circuit layers are electrically connected through the plating through hole (PTH) or via. Since a chip package carrier has the advantages of dense wiring, compact assembly and good electrical performance, it is most widely used in the chip package structure.

Typically, the structure of the multi-layered circuit board commonly formed by the build-up method or the laminating method so that it has the features of high wiring density and small pitch. Since the rigidity of the ultra-thin substrate is poor, it is necessary to provide a metal (such as aluminum substrate or copper substrate) as a supporting carrier. Then, mass of gel are coated on the metal, and then the plurality of circuit layers and the plurality of dielectric layer are alternatively arranged on the two opposite surfaces of the metal. Finally, the gel is removed so that the circuit layers and the dielectric layers are separated from the metal to form two multi-layered circuit boards separated from each other. Moreover, as for forming the plating through hole or via in the multi-layered circuit board, after a dielectric layer is formed, a blind via is formed to expose the circuit layer underneath the dielectric layer. Then, by using copper plating method, a copper layer is plated in the blind via and on the dielectric layer to form connecting layers and the plating through hole or via.

Since, conventionally, the metal is provided to be the supporting carrier of the copper foil and the cost of the metal is relatively high, the cost for manufacturing the multi-layered circuit board is high. Also, the mass of gel is used to fix the copper foil on the metal so that it is difficult to remove the gel and the manufacturing yield is hardly improved. Moreover, as for the circuit layer formed by the copper plating method, the thickness uniformity of the copper layer is poor so that when the required thickness of the circuit layer is small, it is necessary to perform the thinning process (such as etching process) to decrease the thickness of the circuit layer. Thus, the number of the process steps for manufacturing the multi-layered circuit board is increased and the manufacturing yield of the multi-layered circuit board is decreased.

SUMMARY OF THE INVENTION

The present invention provides a method for forming a package carrier capable of simplifying the manufacturing steps, decreasing the manufacturing cost, increasing the manufacturing yield and further increasing the product reliability.

The present invention provides a method for forming a thin copper laminate without carrier and be handled on process. A first copper foil layer, a second copper foil layer on the first copper foil layer, a third copper foil layer and a fourth copper foil layer on the third copper foil layer are provided. The second foil layer is partially glued to the fourth copper foil layer by an adhesive gel or is partially attached to the fourth copper foil layer by welding copper foil. A plurality of first through holes extending from the first copper foil layer to the third copper foil layer are formed. A first dielectric layer and a first conductive layer disposed thereon are compressed on the first copper foil layer, and a second dielectric layer and a second conductive layer disposed thereon are compressed on the third copper foil layer. The first dielectric layer and the second dielectric layer face to the first copper foil layer and the third copper foil layer respectively, and portions of the first dielectric layer and the second dielectric layer fill in the first through holes. The first conductive layer and the second conductive layer are patterned to form a first circuit layer and a second circuit layer. Then, a third dielectric layer and a fifth copper foil layer disposed thereon are compressed on the first circuit layer and the adhesive gel is removed to from a first carrier unit. A plurality of first conductive blind via structures connecting the fifth copper foil layer and the first circuit layer are formed, and a plurality of second conductive blind via structures connecting the first copper foil layer and the first circuit layer are formed. Thin coppers laminate without carrier and can be handled on process.

In one embodiment of the present invention, the thickness of the second copper foil layer is substantially larger than the thickness of the first copper foil layer. Thickness of the first copper foil layer is substantially equal to the thickness of the third copper foil layer. The thickness of the second copper foil layer is substantially equal to the thickness of the fourth copper foil layer.

In one embodiment of the present invention, the adhesive gel includes cyanoacrylate (usually referred as an instant glue) or polypropylene resin (i.e. PP gel).

In one embodiment of the present invention, a method of forming the through holes includes mechanical drilling.

In one embodiment of the present invention, a sum of the thickness of the first dielectric layer and the thickness of the first conductive layer is substantially larger than a sum of the thickness of the first copper foil layer and the thickness of the second foil layer. A sum of the thickness of the second dielectric layer and the thickness of the second conductive layer is substantially larger than a sum of the thickness of the third copper foil layer and the thickness of the fourth copper foil layer.

In one embodiment of the present invention, before the step of patterning the first conductive layer and the second conductive layer, the method of forming the package carrier further comprises forming a plurality of second through holes extending from the first conductive layer to the second conductive layer.

In one embodiment of the present invention, the third dielectric layer and the fifth copper foil layer disposed on the third dielectric layer are compressed on the first circuit layer after the adhesive gel is removed.

In one embodiment of the present invention, the third dielectric layer and the fifth copper foil layer disposed on the third dielectric layer are compressed on the first circuit layer before the adhesive gel is removed.

In one embodiment of the present invention, the step of compressing the third dielectric layer and the fifth copper foil layer disposed on the third dielectric layer on the first circuit layer further comprises compressing a fourth dielectric layer and a sixth copper foil layer disposed thereon on the second circuit layer.

In one embodiment of the present invention, a method of removing the adhesive gel includes a mechanical drilling or a milling machine process.

In one embodiment of the present invention, after the step of removing the adhesive gel, the method for forming the package carrier further comprises removing the second copper foil layer.

In an embodiment of the present invention, a method of removing the second copper foil layer includes a lift-off method.

In one embodiment of the present invention, the first carrier unit comprises the fifth copper foil layer, the third dielectric layer, the first circuit layer, the first dielectric layer and the first copper foil layer, and the method for forming the first conductive blind via structures and the second conductive blind via structures is described as follows. A mechanical drilling is performed on the fifth copper foil layer and the first copper foil layer so as to form a plurality of first blind via extending from the fifth copper foil layer to the first circuit layer and a plurality of second blind vias extending from the first copper foil layer to the first circuit layer. The first blind vias and the second blind vias expose a portion of the first circuit layer. A chemical copper layer is formed in the first blind vias and the second blind vias, wherein the chemical copper layer connects the fifth copper foil layer and the first circuit layer and connects the first copper foil layer and the first circuit layer. A first patterned dry film photoresist layer is formed on the fifth copper foil layer and a second patterned dry film photoresist layer is formed on the first copper foil layer. The first patterned dry film photoresist layer at least exposes the first blind vias and the second patterned dry film photoresist layer at least exposes the second blind vias. An copper plating copper layer is formed at least in the first blind vias and the second blind vias, wherein the copper plating copper layer fills up the first blind vias and the second blind vias and covers a portion of the chemical copper layer. The first patterned dry film photoresist layer and a portion of the fifth copper foil layer under the first patterned dry film photoresist layer, and the second patterned dry film photoresist layer and a portion of the first copper foil layer under the second patterned dry film photoresist layer are removed to expose a portion of the third dielectric layer and a portion of the first dielectric layer so as to form the first conductive blind via structures in the first blind vias and the second conductive blind via structures in the second blind vias.

In one embodiment of the present invention, the mechanical drilling includes a laser drilling.

In one embodiment of the present invention, the method for forming the chemical copper layer includes an electroless plating process.

In one embodiment of the present invention, the method for removing the first patterned dry film photoresist layer and a portion of the fifth copper foil layer under the first patterned dry film photoresist layer, and the second patterned dry film photoresist layer and a portion of the first copper foil layer under the second patterned dry film photoresist layer includes an etching process.

In one embodiment of the present invention, after the first patterned dry film photoresist layer and a portion of the fifth copper foil layer under the first patterned dry film photoresist layer, and the second patterned dry film photoresist layer and a portion of the first copper foil layer under the second patterned dry film photoresist layer are removed, the method for forming the package carrier further comprises the steps described as follows. A first protecting layer is formed on the third dielectric layer and a second protecting layer is formed on the first dielectric layer. The first protecting layer covers the third dielectric layer and the first conductive blind via structures exposed by the third dielectric layer, and the second protecting layer covers the first dielectric layer and the second conductive blind via structures exposed by the first dielectric layer.

In one embodiment of the present invention, the method of forming the first protecting layer and the second protecting layer includes a screen printing.

In one embodiment of the present invention, after the step of forming the first protecting layer and the second protecting layer, the method of forming the package carrier further comprises performing a polishing process to remove a portion of the first protecting layer until the first conductive blind via structures are exposed and to remove a portion of the second protecting layer until the second conductive blind via structures are exposed. The rest portion of the first protecting layer and the rest portion of the second protecting layer are removed.

In one embodiment of the present invention, after the step of forming the first conductive blind via structures and the second conductive blind via structures, the method for forming the package carrier further comprises forming a first solder mask layer on the third dielectric layer, wherein the first solder mask layer has a plurality of first openings exposing the first conductive blind via structures. A second solder mask layer is formed on the first dielectric layer, wherein the second solder mask layer has a plurality of second openings exposing the second conductive blind via structures.

Accordingly, in the present invention, the second copper foil layer is partially bonded the fourth copper foil layer, so that the first copper foil layer, the second copper foil layer, the third copper foil layer and the fourth copper foil layer are bonded to each other. Comparing with the conventional technique, in the package carrier formation method of the present invention, it is not necessary to adopt the metal as the supporting carrier so that the cost for manufacturing the package carrier is decreased. Moreover, the first conductive layer and the second conductive layer are laminated by the compressing process, and then the first circuit layer and the second circuit layer are formed by the patterning method. Therefore, by comparing with the conventional technique that the circuit layers are formed by the copper plating method, the first circuit layer and the second circuit layer have relatively better copper thickness uniformities.

In order to make the aforementioned and other features and advantages of the invention more comprehensible, embodiments accompanying figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
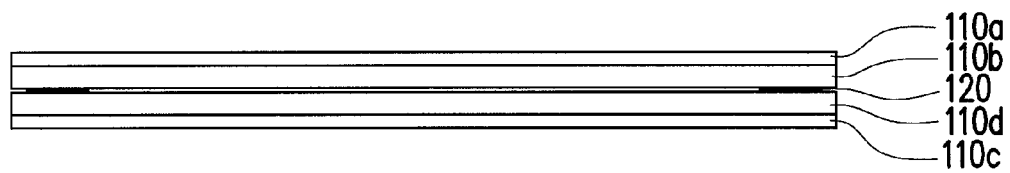
FIGS. 1A through 1P are schematic cross-sectional views illustrating a manufacturing method of a package carrier according to one embodiment of the present invention.
Figure 1B:
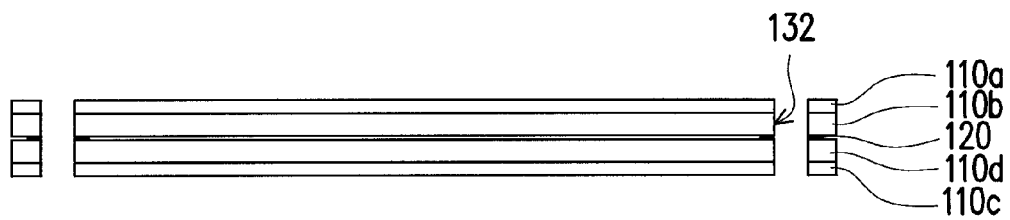
Figure 1C:
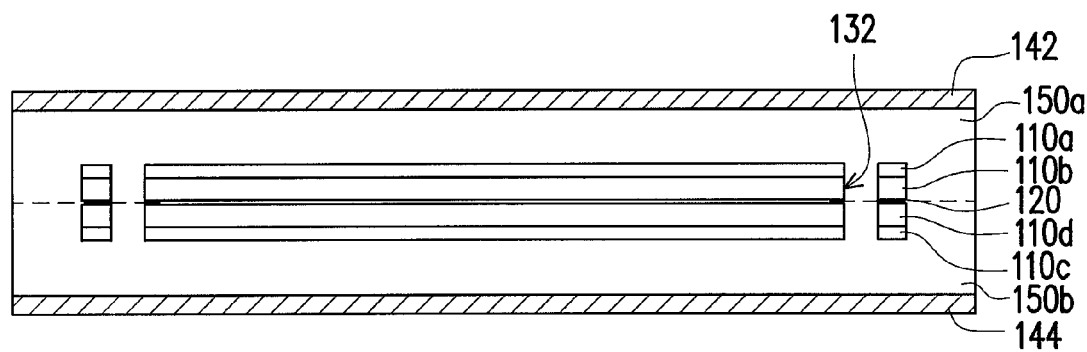
Figure 1D:
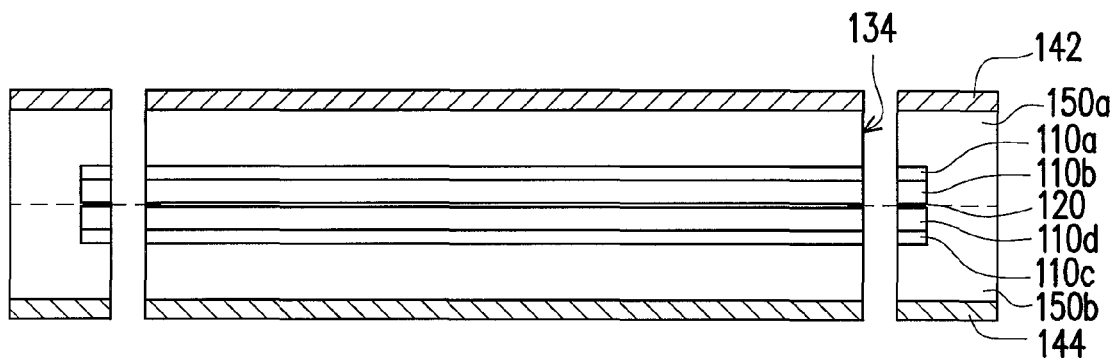
Figure 1E:
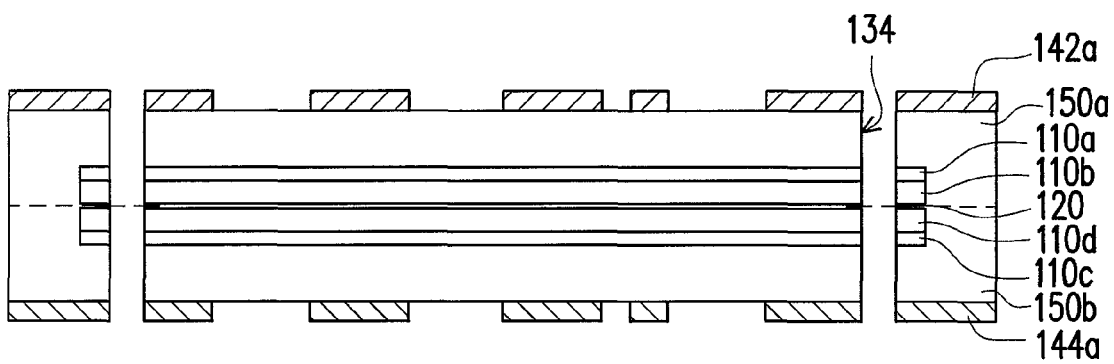
Figure 1F:
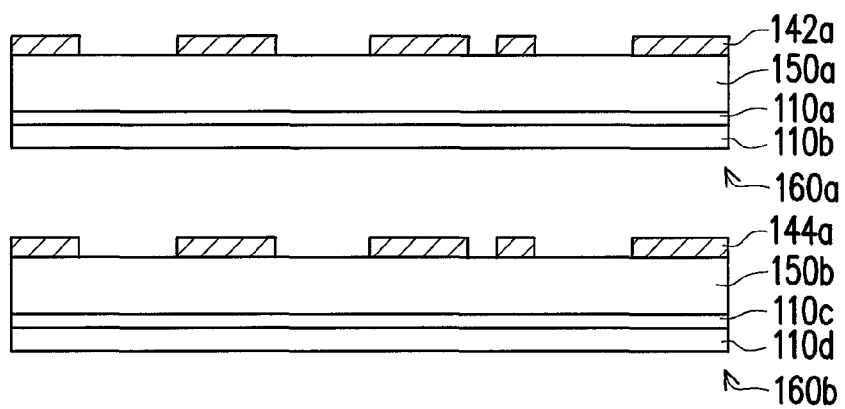
Figure 1G:
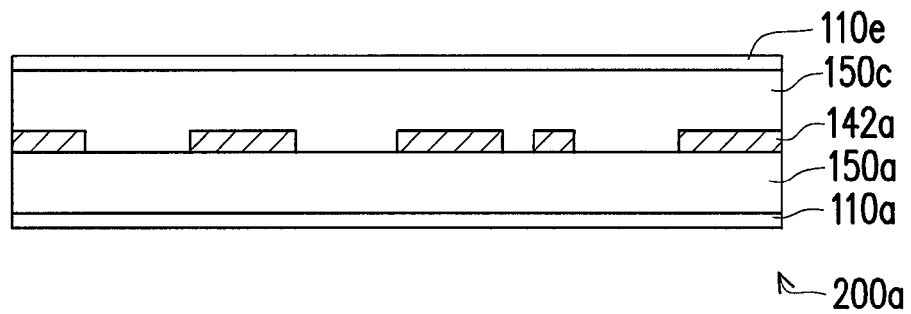
Figure 1H:
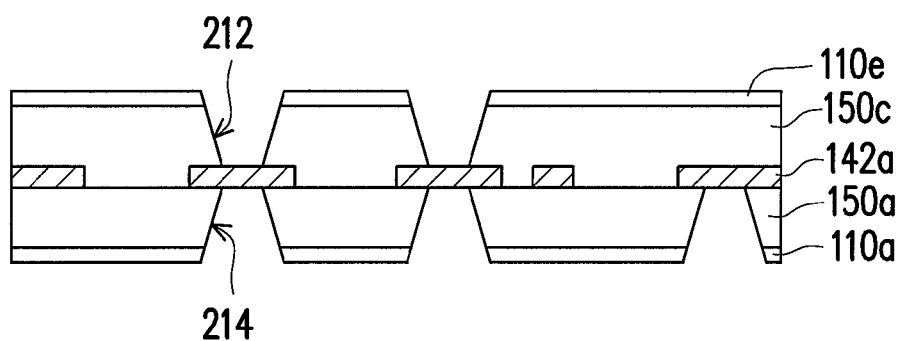
Figure 1I:
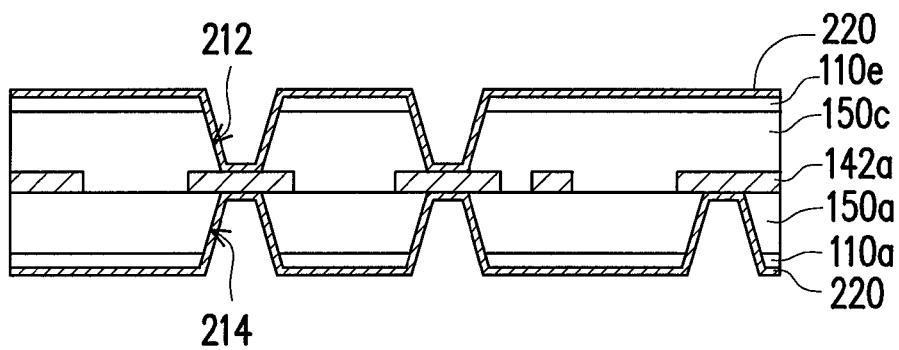
Figure 1J:
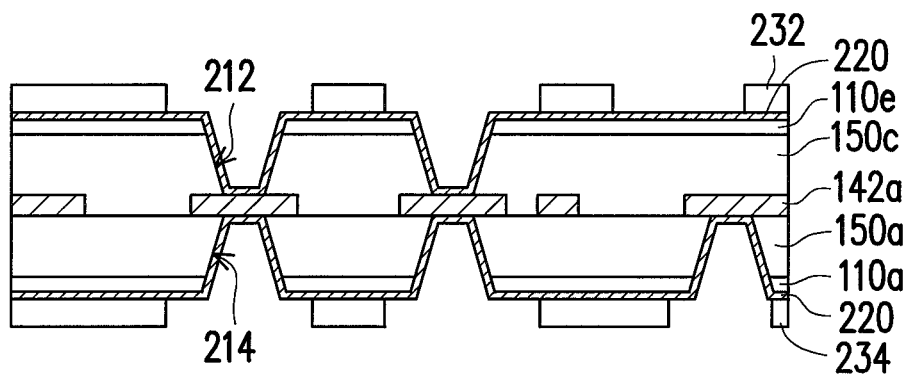
Figure 1K:
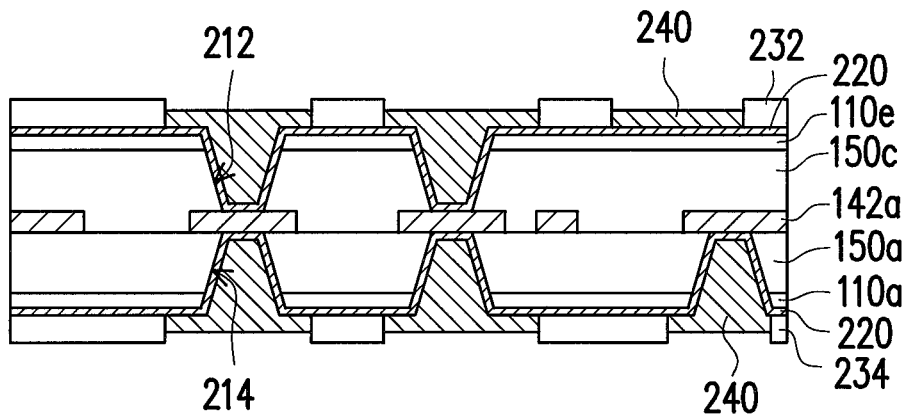
Figure 1L:
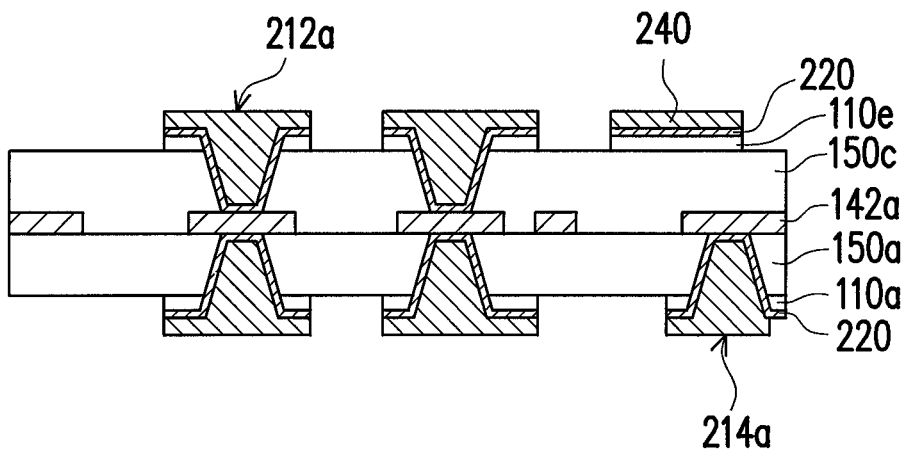
Figure 1M:
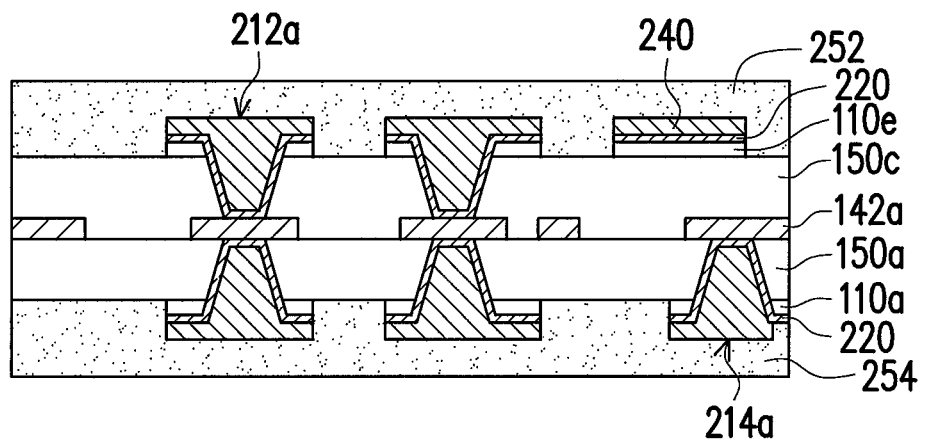
Figure 1N:
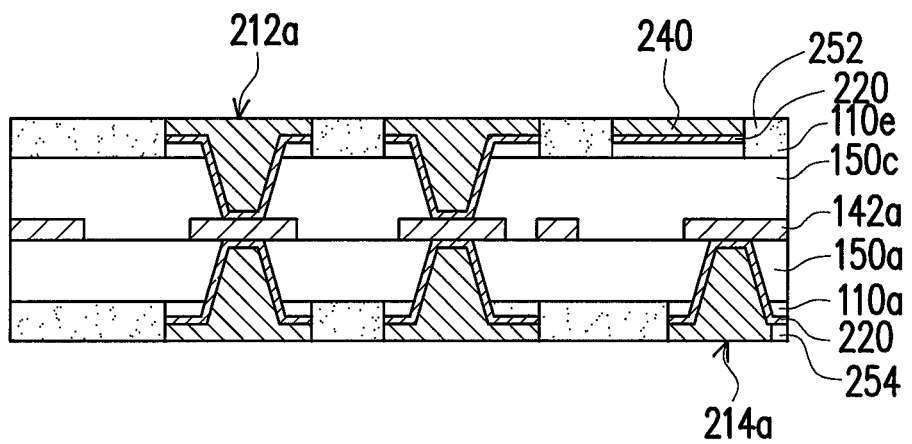
Figure 1O:
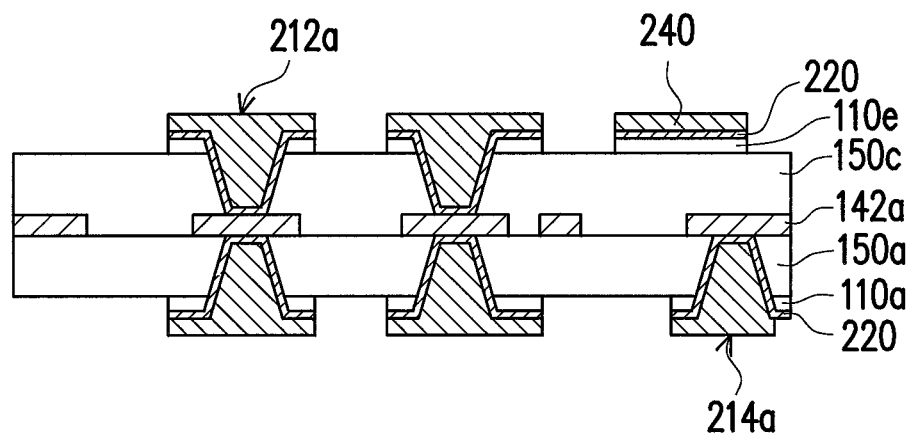
Figure 1P:
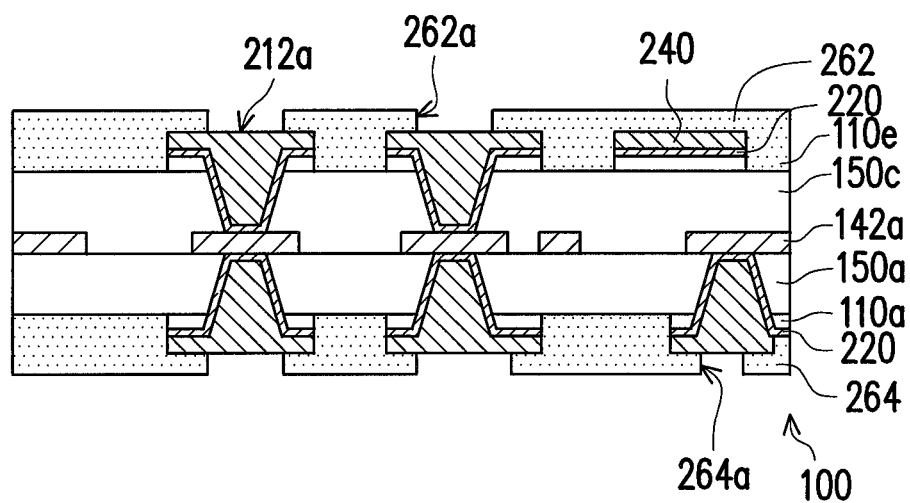

FIGS. 1A through 1P are schematic cross-sectional views illustrating a manufacturing method of a package carrier according to one embodiment of the present invention. As shown in FIG. 1A, a first copper foil layer 110a, a second copper foil layer 110b on the first copper foil layer 110a, a third copper foil layer 110c and a fourth copper foil layer 110d on the third copper foil layer 110c are provided. The second foil layer 110b is partially bonded the fourth copper foil layer 100d by an adhesive gel 120. That is, the adhesive gel 120 is disposed between the second copper foil layer 110b and the fourth copper foil layer 110d, and the second copper foil layer 110b is partially glued to the fourth copper foil layer 110d. Moreover, the first copper foil layer 110a and the second copper foil layer 110b on the first copper foil layer 110a can be regarded as a coreless structure layer. Similarly, the third copper foil layer 110c and the fourth copper foil layer 110d on the third copper foil layer 110c can be regarded as a coreless structure layer.

In the present embodiment, the thickness of the second copper foil layer 110b is substantially larger than the thickness of the first copper foil layer 110a, and the thickness of the first copper foil layer 110a can be, for example, 3 micrometers, and the thickness of the second copper foil layer 110b can be, for example, 12 micrometers. The thickness of the first copper foil layer 110a is substantially equal to the thickness of the third copper foil layer 110c. In other words, the thickness of the third copper foil layer 110c can also be, for example, 3 micrometers. The thickness of the second copper foil layer 110b is substantially equal to the thickness of the fourth copper foil layer 110d. In other words, the thickness of the fourth copper foil layer 110d can also be, for example, 12 micrometers. Moreover, the second copper foil layer 110b of the present embodiment can be used to support the first copper foil layer 110a. Similarly, the fourth copper foil layer 110d can also be used to support the third copper foil layer 110c. Therefore, in the present embodiment, it is not necessary to use the conventional metal as the supporting carrier and the manufacturing cost can be decreased. In addition, in the present embodiment, the adhesive gel 120 includes, for example, cyanoacrylate (usually referred as an instant glue) or polypropylene resin (i.e. PP gel). It should be noticed that, although the second copper foil layer 110b is bonded the fourth copper foil layer 110d through the adhesive gel 120 in the present embodiment, the second copper foil layer 110b can be also bonded the fourth copper foil layer 110d through the welding copper foil method in other embodiments not shown in the drawings. That is, in the other embodiments, the adhesive gel 120 is the welded copper foil. Thus, the aforementioned welding copper foil method for bonding the second copper foil layer 110b and the fourth copper foil layer 110d still within the scope of the present invention.

Thereafter, as shown in FIG. 1B, a plurality of first through holes 132 extending from the first copper foil layer 110a to the third copper foil layer 110c are formed. That is, the first through holes 132 at least penetrate through the first copper foil layer 110a, the second copper foil layer 110b, the fourth copper foil layer 110d and the third copper foil layer 110c. In the present embodiment, the method of forming the first through holes 132 includes mechanical drilling.

As shown in FIG. 1C, a first dielectric layer 150a and a first conductive layer 142 disposed on the first dielectric layer 150a are compressed on the first copper foil layer 110a, and, meanwhile, a second dielectric layer 150b and a second conductive layer 144 disposed on the second dielectric layer 150b are compressed on the third copper foil layer 110c. In the present embodiment, the first dielectric layer 150a and the second dielectric layer 150b face to the first copper foil layer 110a and the third copper foil layer 110c respectively, and portions of the first dielectric layer 150a and the second dielectric layer 150b fill in the first through holes 132. In addition, the material of the first conductive layer 142 and the second conductive layer 144 can be, for example, copper.

Particularly, in the present embodiment, a sum of the thickness of the first dielectric layer 150a and the thickness of the first conductive layer 142 is substantially larger than a sum of the thickness of the first copper foil layer 110a and the thickness of the second foil layer 110b. Further, the thickness of the first dielectric layer 150a can be, for example, 40 micrometers, and the thickness of the first conductive layer 142 can be, for example, 18 micrometers. Similarly, a sum of the thickness of the second dielectric layer 150b and the thickness of the second conductive layer 144 is substantially larger than a sum of the thickness of the third copper foil layer 110c and the thickness of the fourth copper foil layer 110d. Further, the thickness of the second dielectric layer 150b is substantially equal to the thickness of the first dielectric layer 150a so that the thickness of the second dielectric layer 150b can be, for example, 40 micrometers. Also, the thickness of the second conductive layer 144 is substantially equal to the thickness of the first conductive layer 142 so that the thickness of the second conductive layer 144 can be, for example, 18 micrometers.

Furthermore, as shown in FIG. 1D, a plurality of second through holes 134 extending from the first conductive layer 142 to the second conductive layer 144 are formed. The second through holes 134 at least penetrate through the first conductive layer 142, the first dielectric layer 150a, the first copper foil layer 110a, the second copper foil layer 110b, the fourth copper foil layer 110c, the third copper foil layer 110c, the second dielectric layer 150b and the second conductive layer 144. Moreover, the second through holes 134 can be used to assist the removal of the adhesive gel 120 in later process step (i.e. the removal of the bonding region of the second copper foil layer 110b and the fourth copper foil layer 110d). Usually, the first conductive layer 142 and the second conductive layer 144 have several metal patterns (not shown) thereon, and the metal patterns are used as the positioning and aligning standard points in the manufacturing process. That is, the metal patterns on the first conductive layer 142 and the second conductive layer 144 can be used as the positioning and aligning standards of the first copper foil layer 110a and the third copper foil layer 110c. Further, the metal patterns on the first conductive layer 142 and the second conductive layer 144 can also used as the positioning and aligning standards of the later formed fifth copper foil layer 110e (as shown in FIG. 1G).

Next, as shown in FIG. 1E, the first conductive layer 142 and the second conductive layer 144 are respectively patterned, so as to form a first circuit layer 142a and a second circuit layer 144a. The method for patterning the first conductive layer 142 and the second conductive layer 144 includes a photolithography and etching process. Particularly, the first conductive layer 142 and the second conductive layer 144 of the present embodiment are compressed on the first dielectric layer 150a and the second dielectric layer 150b respectively by the compressing process and are transformed in the first circuit layer 142a and the second circuit layer 144a respectively by the patterning process. Therefore, by comparing with the conventional technique that the circuit layers are formed by the copper plating method, the first circuit layer 142a and the second circuit layer 144a of the present embodiment have relatively better copper thickness uniformities.

Then, as shown in FIG. 1F, the adhesive gel 120 is removed to form a first circuit structure 160a and a second circuit structure 160b which are separated from each other. In the present embodiment, the second through holes 134 can be used to assist the removal of the adhesive gel 120. That is, because of the formation of the second through holes 134, the adhesion of the adhesive gel 120 between the second copper foil layer 110b and the fourth copper foil layer 110d is damaged. Thus, it is easy to remove the adhesive gel 120. Moreover, a method for removing the adhesive gel can be, for example, a mechanical drilling or a milling machine process. It should be noticed that, in the present embodiment, since the adhesive gel 120 only partially located between the second copper foil layer 110b and the fourth copper foil layer 110d, the step of the present embodiment for removing the adhesive gel 120 is more simple and easy by comparing with the conventional technique for removing the mass of the gel between the circuit layer and the metal. Thus, the manufacturing yield can be increased.

In the present embodiment, the first circuit structure 160a and the second circuit structure 160b formed after the adhesive gel 120 is removed are the symmetrical structures. Further, the first circuit structure 160a comprises the first circuit layer 142a, the first dielectric layer 150a, the first copper foil layer 110a and the second copper foil layer 110b which are stacked sequentially. The second circuit structure 160b comprises the second circuit layer 144a, the second dielectric layer 150b, the third copper foil layer 110c and the fourth copper foil layer 110d which are stacked sequentially. To simplify the explanation, the first circuit structure 160a is used as an example in the following description of the formation of the package carrier.

As shown in FIG. 1G, the second copper foil layer 110b is removed, and a third dielectric layer 150c and a fifth copper foil layer 110e on the third dielectric layer 150c are compressed on the first circuit layer 142a. In the present embodiment, the method for removing the second copper foil layer 110b can be, for example, a lift-off process. That is, by using the lift-off process, the second copper foil layer 110b is lifted off the first copper foil layer 110a. Moreover, since the third dielectric layer 150c and the fifth copper foil layer 110e are compressed on the first circuit layer 142a, the first circuit layer 142a becomes an inner circuit layer. In other words, the first circuit layer 142a is a circuit layer buried between the third dielectric layer 150c and the first dielectric layer 150a. Moreover, the metal patterns (not shown) on the first circuit layer 142a (which is formed by patterning the first conductive layer 142) are used as the standards in the step for compressing the fifth copper foil layer 110e on the first circuit layer 142a so that the alignment precision between the first copper foil layer 110a, the first circuit layer 142a and the fifth copper foil layer 110e can be ensured.

Usually, the thickness of the fifth copper foil layer 110e is relatively small and can be, for example, 3 micrometers. Hence, when the compressing process is applied on the fifth copper foil layer 110e, a thick copper foil layer (not shown) with a thickness about 12 micrometers is usually disposed on the fifth copper foil layer 110e. Thus, the fifth copper foil layer 110e can be prevented from being bent after the compressing process. Therefore, the surface flatness of the fifth copper foil layer 110e after the compressing process can be well maintained. Thereafter, after the compressing process, the thick copper foil layer is lifted off to leave the thin fifth copper foil layer 110e for the later performed processes.

In other words, in the present embodiment, the third dielectric layer 150c and the fifth copper foil layer 110e disposed on the third dielectric layer 150c are compressed on the first circuit layer 142a after the adhesive gel 120 is removed. However, the present invention is not limited to the step order that the third rein layer 150c and the fifth copper foil layer 110e are compressed on the first circuit layer 142a after the adhesive gel 120 is removed. In other embodiments, the third dielectric layer 150c and the fifth copper foil layer 110e disposed on the third dielectric layer 150c can be compressed on the first circuit layer 142a before the adhesive gel 120 is removed.

Figure 2A:
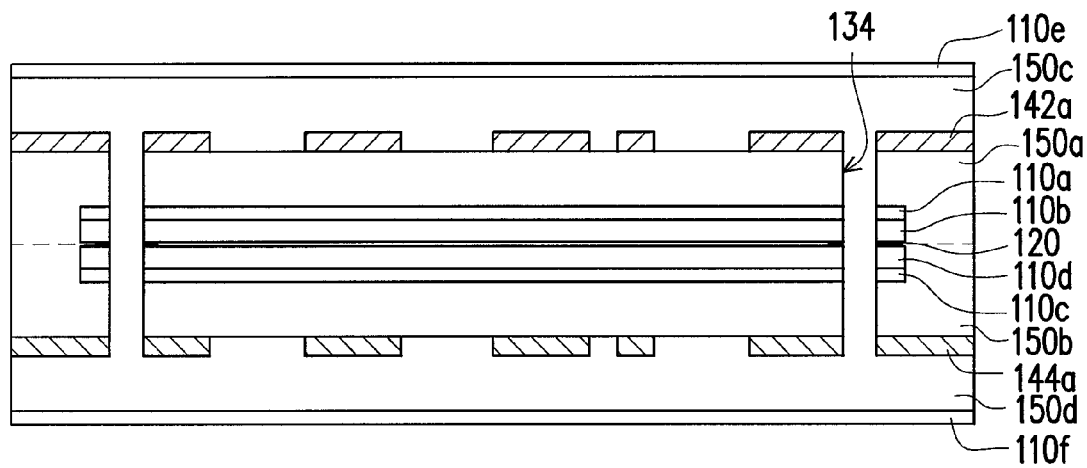
FIGS. 2A through 2B are schematic cross-sectional views illustrating the steps of compressing the third dielectric layer and the fifth copper foil layer and removing the adhesive gel according to another embodiment of the present invention.
Figure 2B:
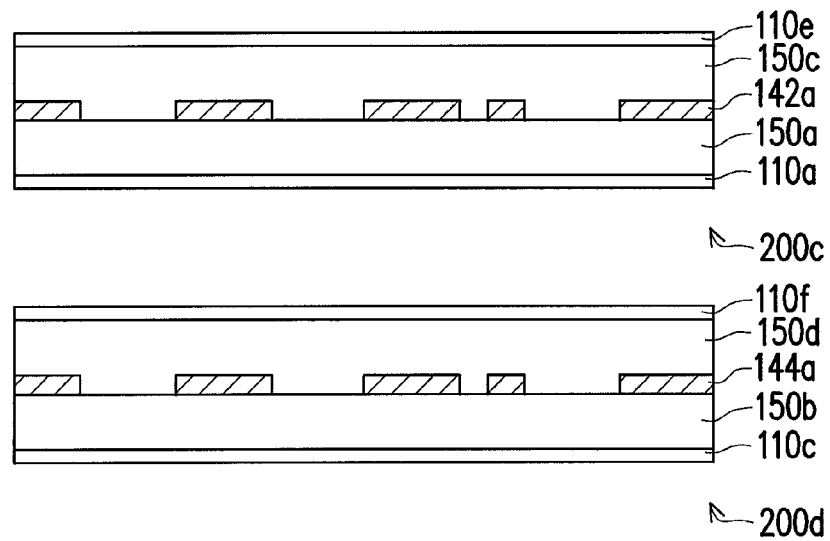

More specifically, as shown in FIG. 2A, the third dielectric layer 150c and the fifth copper foil layer 110e on the third dielectric layer 150c are compressed on the first circuit layer 142a, and, meanwhile, a fourth dielectric layer 150d and a sixth copper foil layer 110f on the fourth dielectric layer 150d are compressed on the second circuit layer 144a. Then, as shown in FIG. 2B, the adhesive gel 120, the second copper foil layer 110b and the fourth copper foil layer 110d are removed to form a third carrier unit 200c and a fourth carrier unit 200d which are separated from each other. Moreover, the third carrier unit 200c and the fourth carrier unit 200d formed by removing the adhesive gel 120, the second copper foil layer 110b and the fourth copper foil layer 110d are the symmetrical structures. The third carrier unit 200c comprises the fifth copper foil layer 110e, the third dielectric layer 150c, the first circuit layer 142a, the first dielectric layer 150a and the first copper foil layer 110a which are stacked sequentially. Similarly, the fourth carrier unit 200d comprises the sixth copper foil layer 110f, the fourth dielectric layer 150d, the second circuit layer 144a, the second dielectric layer 150b and the third copper foil layer 110c which are stacked sequentially. In other words, the order of the steps for compressing the dielectric layer and the copper foil layer on the dielectric layer on the circuit layer and removing the adhesive gel 120 can be selectively adjusted according to the process requirement. Hence, the embodiment shown in FIGS. 1F through 1G is only an exemplary of the present invention and the present invention is not limited to this embodiment.

Thus, the manufacture of the first carrier unit 200a is completed. The first carrier unit 200a comprises the fifth copper foil layer 110e, the third dielectric layer 150c, the first circuit layer 142a, the first dielectric layer 150a and the first copper foil layer 110a which are stacked sequentially.

Further, as shown in FIG. 1H, a mechanical drilling is performed on the fifth copper foil layer 110e and the first copper foil layer 110a so as to form a plurality of first blind via 212 extending from the fifth copper foil layer 110e to the first circuit layer 142a and a plurality of second blind vias 214 extending from the first copper foil layer 110a to the first circuit layer 142a. The first blind vias 212 and the second blind vias 214 expose a portion of the first circuit layer 142a. In the present embodiment, the mechanical drilling can be, for example, a laser drilling. That is, the first blind vias 212 and the second blind vias 214 are formed by using the laser drilling.

As shown in FIG. 1I, a chemical copper layer 220 is formed in the first blind vias 212 and the second blind vias 214, wherein the chemical copper layer 220 connects the fifth copper foil layer 110e and the first circuit layer 142a and connects the first copper foil layer 110a and the first circuit layer 142a. Specifically, in the present embodiment, the chemical copper layer 220 covers the fifth copper foil layer 110e, the first blind vias 212, the first copper foil layer 110a and the second blind vias 214. Further, the fifth copper foil layer 110e is electrically connected to the first circuit layer 142a through the chemical copper layer 220, and the first copper foil layer 110a is electrically connected to the first circuit layer 142a through the chemical copper layer 220. Moreover, the method for forming the chemical copper layer 220 can be, for example, an electroless plating process.

As shown in FIG. 1J, a first patterned dry film photoresist layer 232 is formed on the fifth copper foil layer 110e, and a second patterned dry film photoresist layer 234 is formed on the first copper foil layer 110a. The first pattern dry film photoresist layer 232 at least exposes the first blind vias 212 and the second patterned dry film photoresist layer 234 at least exposes the second blind vias 214. Specifically, in the present embodiment, the first patterned dry film photoresist layer 232 exposes the chemical copper layer 220 in the first blind vias 212 and exposes a portion of the chemical copper layer 220 over the fifth copper foil layer 110e. The second patterned dry film photoresist layer 234 exposes the chemical copper layer 220 in the second blind vias 214 and exposes a portion of the chemical copper layer 220 over the first copper foil layer 110a.

As shown in FIG. 1K, an copper plating copper layer 240 is formed at least in the first blind vias 212 and the second blind vias 214, wherein the copper plating copper layer 240 fills up the first blind vias 212 and the second blind vias 214 and covers a portion of the chemical copper layer 220. In the present embodiment, the copper plating copper layer 240 is formed within the first blind vias 212, the second blind vias 214 and on a portion of the chemical copper layer 220 exposed by the first patterned dry film photoresist layer 232 and the second patterned dry film photoresist layer 234 by using a via filling plating process with the first patterned dry film photoresist layer 232 and the second patterned dry film photoresist layer 234 as the masks.

As shown in FIG. 1L, the first patterned dry film photoresist layer 232, and a portion of the chemical copper layer 220 and the fifth copper foil layer 110e under the first patterned dry film photoresist layer 232 are removed. Also, the second patterned dry film photoresist layer 234, and a portion of the chemical copper layer 220 and the first copper foil layer 110a under the second patterned dry film photoresist layer 234 are removed. Therefore, the third dielectric layer 150c and a portion of the first dielectric layer 150a are exposed, and a first conductive blind via structure 212a is formed in each of the first bind holes 212 and a second conductive blind via structure 214a is formed in each of the second bind holes 214. In the present embodiment, the method for removing the first patterned dry film photoresist layer 232, and a portion of the chemical copper layer 220 and the fifth copper foil layer 110e under the first patterned dry film photoresist layer 232, and the second patterned dry film photoresist layer 234, and a portion of the chemical copper layer 220 and the first copper foil layer 110a under the second patterned dry film photoresist layer 234 can be, for example, an etching process. Thus, the first conductive blind via structures 212a and the second conductive blind via structures 214a, both of which are electrically connected to the first circuit layer 142a, are formed.

As shown in FIG. 1M, a first protecting layer 252 is formed on the third dielectric layer 150c and a second protecting layer 254 is formed on the first dielectric layer 150a. In the present embodiment, the first protecting layer 252 covers the third dielectric layer 150c and the first conductive blind via structures 212a exposed by the third dielectric layer 150c so that the integrity of the pattern of the first conductive blind via structures 212a can be well protected. Similarly, the second protecting layer 254 covers the first dielectric layer 150a and the second conductive blind via structures 214a exposed by the first dielectric layer 150a so that the integrity of the pattern of the second conductive blind via structures 214a can be well protected. Moreover, the method for forming the first protecting layer 252 and the second protecting layer 254 can be, for example, a screen printing. The material of the first protecting layer 252 and the second protecting layer 254 can be, for example, ink.

As shown in FIG. 1N, a polishing process is performed to remove a portion of the first protecting layer 252 until the surface of the first conductive blind via structures 212a are exposed and to remove a portion of the second protecting layer 254 until the surface of the second conductive blind via structures 214a are exposed. Meanwhile, the surface of the first protecting layer 252 is substantially aligned with the surfaces of the first conductive blind via structures 212a, and the surface of the second protecting layer 254 is aligned with the surfaces of the second conductive blind via structures 214a.

Furthermore, as shown in FIG. 1O, the rest portion of the first protecting layer 252 and the rest portion of the second protecting layer 254 are removed to expose a portion of the third dielectric layer 150c, the first conductive blind vias 212a exposed by the third dielectric layer 150c, a portion of the first dielectric layer 150a and the second conductive blind vias 214a exposed by the first dielectric layer 150a. In the present embodiment, the purpose of the process comprises, in sequence, forming the first protecting layer 252 and the second protecting layer 254, performing the polishing process and removing the first protecting layer 252 and the second protecting layer 254 is to improve the surface flatness of the surfaces of the first conductive blind via structures 212a and the second conductive blind via structures 214a.

As shown in FIG. 1P, a first solder mask layer 262 is formed on the third dielectric layer 150c and a second solder mask layer 264 is formed on the first dielectric layer 150a. In the present embodiment, the first solder mask layer 262 has a plurality of first openings 262a, wherein a portion of the first conductive blind via structures 212a exposed by the first openings 262a are used as the bonding pads. The second solder mask layer 264 has a plurality of second openings 264a, wherein a portion of the second conductive blind via structures 214a exposed by the second openings 264a are used as the bonding pads. Herein, the fabricating of the package carrier 100 is completed.

The first conductive blind via structures 212a exposed by the first openings 262a of the first solder mask layer 262 are used as the bonding pads, and the second conductive blind via structures 214a exposed by the second openings 264a of the second solder mask layer 264 are used as the bonding pads. Thus, after the chip (not shown) is electrically connected to the bonding pads by the wire bonding or flip-chip process and the chip is encapsulated in a compound (not shown), the chip package process is completed. That is, the package carrier 100 of the present embodiment is suitable to be a chip package carrier.

In other words, in the present embodiment, because it is not necessary to use the metal for supporting the first copper foil layer 110a and the second copper foil layer 110c, the method for manufacturing the package carrier is capable of effectively decreasing the manufacturing cost by comparing with the conventional technique. In addition, in the present embodiment, the first circuit layer 142a and the second circuit layer 144a are formed by compressing the first conductive layer 142 and the second conductive layer 144, and then patterning the first conductive layer 142 and the second conductive layer 144. By comparing with the conventional technique that the circuit layers are formed by the copper plating method, the first circuit layer 142a and the second circuit layer 144a of the present embodiment have relatively better copper thickness uniformities. Further, in the present embodiment, by using the first circuit layer 142a (which is made from the first conductive layer 142) as the positioning and aligning standard of the first copper foil layer 110a and the fifth copper foil layer 110e. Hence, the alignment precision of the package carrier 100 can be effectively increased so that the manufacturing yield and the reliability of the package carrier 100 are improved.

According to the above description, in the present invention, the copper foil layers are bonded each other by using the adhesive gel. Comparing with the conventional technique in which the metal is used as the carrier for supporting the circuit layer, in the present invention, the method for forming the package carrier is capable of effectively decreasing the cost for manufacturing the package carrier. Also, in the present invention, it is not necessary to use mass of gel to fix the circuit layer on the metal as taught by the conventional technique so that the method for forming the package carrier may not confront the difficulty in removing the mass of gel layer. Therefore, the manufacturing process of the present invention is more simple and easy. Moreover, the conductive layers are laminated by the compressing process, and then the circuit layers are formed by the patterning the conductive layers. Therefore, by comparing with the conventional technique that the circuit layers are formed by the copper plating method, the circuit layers have relatively better copper thickness uniformities. Furthermore, in the present invention, by using one circuit layer as the positioning standard, the alignment precision between the copper foil layers and the circuit layers can be effectively increased. In general, the package carrier formation method of the present invention is capable of simplifying the manufacturing steps, decreasing the manufacturing cost, increasing the manufacturing yield and further increasing the product reliability.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A method of forming a package carrier, the method comprising:
   providing a first copper foil layer, a second copper foil layer on the first copper foil layer, a third copper foil layer and a fourth copper foil layer on the third copper foil layer, wherein the second foil layer is partially bonded the fourth copper foil layer by an adhesive gel;
   forming a plurality of first through holes extending from the first copper foil layer to the third copper foil layer;
   compressing a first dielectric layer and a first conductive layer disposed thereon on the first copper foil layer, and compressing a second dielectric layer and a second conductive layer disposed thereon on the third copper foil layer, wherein the first dielectric layer and the second dielectric layer face to the first copper foil layer and the third copper foil layer respectively, and portions of the first dielectric layer and the second dielectric layer fill in the first through holes;
   patterning the first conductive layer and the second conductive layer to form a first circuit layer and a second circuit layer;
   compressing a third dielectric layer and a fifth copper foil layer disposed thereon on the first circuit layer and removing the adhesive gel to from a first carrier unit; and
   forming a plurality of first conductive blind via structures connecting the fifth copper foil layer and the first circuit layer, and forming a plurality of second conductive blind via structures connecting the first copper foil layer and the first circuit layer.

2. The method of claim 1, wherein a thickness of the second copper foil layer is substantially larger than a thickness of the first copper foil layer, and the thickness of the first copper foil layer is substantially equal to a thickness of the third copper foil layer, and the thickness of the second copper foil layer is substantially equal to a thickness of the fourth copper foil layer.

3. The method of claim 1, wherein a material of the adhesive gel includes cyanoacrylate or polypropylene resin.

4. The method of claim 1, wherein a method of forming the first through holes includes a mechanical drilling.

5. The method of claim 1, wherein a sum of a thickness of the first dielectric layer and a thickness of the first conductive layer is substantially larger than a sum of a thickness of the first copper foil layer and a thickness of the second foil layer, and a sum of a thickness of the second dielectric layer and a thickness of the second conductive layer is substantially larger than a sum of a thickness of the third copper foil layer and a thickness of the fourth copper foil layer.

6. The method of claim 1, before the step of patterning the first conductive layer and the second conductive layer, further comprising forming a plurality of second through holes extending from the first conductive layer to the second conductive layer.

7. The method of claim 1, wherein the third dielectric layer and the fifth copper foil layer disposed on the third dielectric layer are compressed on the first circuit layer after the adhesive gel is removed.

8. The method of claim 1, wherein the third dielectric layer and the fifth copper foil layer disposed on the third dielectric layer are compressed on the first circuit layer before the adhesive gel is removed.

9. The method of claim 8, wherein the step of compressing the third dielectric layer and the fifth copper foil layer disposed on the third dielectric layer on the first circuit layer further comprises compressing a fourth dielectric layer and a sixth copper foil layer disposed thereon on the second circuit layer.

10. The method of claim 1, wherein a method of removing the adhesive gel includes a mechanical drilling or a milling machine process.

11. The method of claim 1, after the step of removing the adhesive gel, further comprising removing the second copper foil layer.

12. The method of claim 11, wherein a method of removing the second copper foil layer includes a lift-off method.

13. The method of claim 1, wherein the first carrier unit comprises the fifth copper foil layer, the third dielectric layer, the first circuit layer, the first dielectric layer and the first copper foil layer, and the method for forming the first conductive blind via structures and the second conductive blind via structures comprises:
   performing a mechanical drilling on the fifth copper foil layer and the first copper foil layer so as to form a plurality of first blind via extending from the fifth copper foil layer to the first circuit layer and a plurality of second blind vias extending from the first copper foil layer to the first circuit layer, wherein the first blind vias and the second blind vias expose a portion of the first circuit layer;
   forming a chemical copper layer in the first blind vias and the second blind vias, wherein the chemical copper layer connects the fifth copper foil layer and the first circuit layer and connects the first copper foil layer and the first circuit layer;

forming a first patterned dry film photoresist layer on the fifth copper foil layer and forming a second patterned dry film photoresist layer on the first copper foil layer, wherein the first patterned dry film photoresist layer at least exposes the first blind vias and the second patterned dry film photoresist layer at least exposes the second blind vias;

forming an copper plating copper layer at least in the first blind vias and the second blind vias, wherein the copper plating copper layer fills up the first blind vias and the second blind vias and covers a portion of the chemical copper layer; and removing the first patterned dry film photoresist layer and a portion of the fifth copper foil layer under the first patterned dry film photoresist layer, and the second patterned dry film photoresist layer and a portion of the first copper foil layer under the second patterned dry film photoresist layer to expose a portion of the third dielectric layer and a portion of the first dielectric layer so as to form the first conductive blind via structures in the first blind vias and the second conductive blind via structures in the second blind vias.

14. The method of claim 13, wherein the mechanical drilling includes a laser drilling.

15. The method of claim 13, wherein a method of forming the chemical copper layer comprises a electroless plating process.

16. The method of claim 13, wherein the method for removing the first patterned dry film photoresist layer and a portion of the fifth copper foil layer under the first patterned dry film photoresist layer, and the second patterned dry film photoresist layer and a portion of the first copper foil layer under the second patterned dry film photoresist layer includes an etching process.

17. The method of claim 13, after the step of removing the first patterned dry film photoresist layer and a portion of the fifth copper foil layer under the first patterned dry film photoresist layer, and the second patterned dry film photoresist layer and a portion of the first copper foil layer under the second patterned dry film photoresist layer, further comprising:

forming a first protecting layer on the third dielectric layer and forming a second protecting layer on the first dielectric layer, wherein the first protecting layer covers the third dielectric layer and the first conductive blind via structures exposed by the third dielectric layer, and the second protecting layer covers the first dielectric layer and the second conductive blind via structures exposed by the first dielectric layer.

18. The method of claim 17, wherein a method of forming the first protecting layer and the second protecting layer includes a screen printing.

19. The method of claim 17, after the step of forming the first protecting layer and the second protecting layer, further comprising:

performing a polishing process to remove a portion of the first protecting layer until the first conductive blind via structures are exposed and to remove a portion of the second protecting layer until the second conductive blind via structures are exposed; and removing a rest portion of the first protecting layer and a rest portion of the second protecting layer.

20. The method of claim 13, after the step of forming the first conductive blind via structures and the second conductive blind via structures, further comprising:

forming a first solder mask layer on the third dielectric layer, wherein the first solder mask layer has a plurality of first openings exposing the first conductive blind via structures; and forming a second solder mask layer on the first dielectric layer, wherein the second solder mask layer has a plurality of second openings exposing the second conductive blind via structures.

* * * * *